(12) United States Patent
Hanaoka et al.

(10) Patent No.: US 7,670,861 B2
(45) Date of Patent: Mar. 2, 2010

(54) CONTROLLING STRESS IN MEMS STRUCTURES

(75) Inventors: Yuko Hanaoka, Kodaira (JP); Tsukasa Fujimori, Kokubunji (JP); Hiroshi Fukuda, London (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/698,023

(22) Filed: Jan. 26, 2007

(65) Prior Publication Data

US 2007/0249082 A1  Oct. 25, 2007

(30) Foreign Application Priority Data

Feb. 3, 2006  (JP)  ............... 2006-026958

(51) Int. Cl.
*H01L 21/00* (2006.01)
*H01L 21/44* (2006.01)
*H01L 21/461* (2006.01)

(52) U.S. Cl. .................. 438/53; 438/683; 438/756; 438/799; 257/E21.573

(58) Field of Classification Search ............. 438/52–53; 257/E21.573
See application file for complete search history.

(56) References Cited

U.S. PATENT DOCUMENTS

| | | | | | |
|---|---|---|---|---|---|
| 6,091,050 | A | * | 7/2000 | Carr | ............ 219/201 |
| 6,472,243 | B2 | | 10/2002 | Gogoi et al. | |
| 6,825,127 | B2 | * | 11/2004 | Ouellet et al. | ............ 438/745 |
| 6,892,582 | B1 | | 5/2005 | Satou et al. | |
| 2003/0207545 | A1 | * | 11/2003 | Yasukawa | ............ 438/459 |
| 2005/0003593 | A1 | * | 1/2005 | Krivokapic | ............ 438/158 |
| 2005/0110101 | A1 | * | 5/2005 | Kaneko et al. | ............ 257/410 |
| 2005/0172703 | A1 | * | 8/2005 | Kley | ............ 73/105 |
| 2006/0007517 | A1 | * | 1/2006 | Tsai | ............ 359/254 |
| 2006/0070449 | A1 | * | 4/2006 | Yokoyama et al. | ............ 73/754 |

FOREIGN PATENT DOCUMENTS

JP  08-321612  5/1995

OTHER PUBLICATIONS

"Silicide" dictionary entry, Academic Press Dictionary of Science and Technology, 1992, Oxford:Elsevier Science and Technology.*

(Continued)

*Primary Examiner*—Hsien-ming Lee
*Assistant Examiner*—Kevin Parendo
(74) *Attorney, Agent, or Firm*—Stites & Harbison PLLC; Juan Carlos A. Marquez, Esq.

(57) ABSTRACT

The objects of the present invention are to form MEMS structures of which stress is controlled while maintaining the performance of high-performance LSI, to integrate MEMS Structures and LSI on a single chip, to electrically and chemically protect the MEMS structure and to reduce the stress of the whole movable part of the MEMS structure. To achieve the above objects, a silicide film formable at a low temperature is used for the MEMS structure. The temperature at the silicide film deposition T1 is selected optionally with reference the heat treatment temperature T2 and the pseudo-crystallization temperature T3. T2, the temperature of manufacturing process after the silicide film deposition, is determined does not cause the degradation of the characteristics of the high-performance LSI indispensable. Thus, the residual stress of the MEMS structures may be controlled.

3 Claims, 8 Drawing Sheets

OTHER PUBLICATIONS

Kasten, Klaus, et al, "CMOS-compatible capacitive high temperature pressure sensors", Elsevier Science S.A., 2000, Sensors and Actuators 85, 2000, pp. 147-152.

Kasten, Klaus, et al., "High temperature pressure sensor with monolithically integrated CMOS readout circuit based on SIMOX technology", The 11th International Conference on Solid-State Sensors and Actuators, Munich, Germany, Jun. 10-14, 2001, pp. 1-2.

Fujmori, T., et al, "Fully CMOS Compatible On-LSI Capacitive Pressure Sensor Fabricated Using Standard Back-End-Of-Line Processes", Transducers, The 13th International Conference on Solid-State Sensors, Actuators and Microsystems, Seoul, Korea, Jun. 5-9, 2005, pp. 37-40.

Ger, Muh-Ling, et al., "Sputtered $WSi_x$ for Micromechanical Structures", J. Mater. Res., vol. 10, No. 7, Jul. 1995, pp. 1710-1720.

* cited by examiner

FIG. 11

| MATERIAL | WSi* | W, Ta, Mo | Al | Cu |
|---|---|---|---|---|
| CORROSION RESISTANCE | ○ | △ | × | ○ |
| FABRICATING OF THICK FILM POSSIBLE | ○ | × | ○ | ○ |
| CONSISTENCY OF LSI PROCESS | ○ | ○ | ○ | △ |

*OTHER SIMILAR CASES: MoSi, TiSi, CoSi, etc.

FIG. 12

| MATERIAL | Ta | WSi | a-Si | poly-Si | Al |
|---|---|---|---|---|---|
| CORROSION RESISTANCE | ○ | ○ | ○ | ○ | × |
| DEPOSITION TEMPERATURE (below 450°C) | ○ | ○ | ○ | × | ○ |
| REDUCTION OF STRESS | ○ | ○ | ○ | ○ | ○ |

CONTROLLING STRESS IN MEMS STRUCTURES

CROSS-REFERENCE TO RELATED APPLICATION

This application is related to U.S. application Ser. No. 11/237,897 filed on Sep. 29, 2005, the disclosure of which is hereby incorporated by reference.

CLAIM OF PRIORITY

The present application claims priority from Japanese application JP 2006-026958 filed on Feb. 3, 2006, the contents of which is hereby incorporated by reference into this application.

FIELD OF THE INVENTION

The present invention relates to a semiconductor device including MEMS structures and manufacturing methods, and to a technology applicable to the construction of MEMS structure 5.

BACKGROUND OF THE INVENTION

Micro-electromechanical system (MEMS) technology has lately been developed to form mechanical sensors of pressure, acceleration, micro switches, transducers and other micro mechanical parts and mechanical systems, by using fine processing technology of semiconductor integrated circuits.

The MEMS technology is roughly divided into bulk MEMS that is fabricated process the Si substrate itself and surface MEMS that is fabricated by deposition thin films on the surface of the Si substrate and repeating patterning processes.

In the application of the MEMS technology to sensors, mechanical transformation of a mechanism due to outside force is converted into electric signals as changes in piezoresistance or capacitance and to be outputted. And normally, the above-mentioned output is processed as signals by a semiconductor integrated circuit (LSI).

In the transducer application of the MEMS technology, the inputs and outputs signals of these transducers are connected with high frequency circuits. Thus, the MEMS structures are often used in combination with a LSI. When a MEMS is used in combination with a LSI for signal processing, each one constitutes a separate chip that making it difficult to fabricate the whole system compact. As both MEMS and LSI are normally fabricated on the Si substrate, it is natural to think of integrating them monolithically on a same substrate. This is already applied to some products, for example patent document 1, Non-patent Documents 1 and 2. These explain the method of fabricating a pressure sensor with MEMS structure in the middle of the process of manufacturing semiconductor device, to fabricate a LSI and a MEMS on a same chip.

On the other hand, the MEMS structure is not a continuous film structure from the Si substrate, unlike normal semiconductor device. Due to the presence of parts suspended in space of a single material film or laminated composite film constituting the MEMS, it is important to control the stress in the film of the MEMS structure part. It is known that, for example, if a tensile pressure is applied on a movable part independent from the periphery of which an end is fixed like a cantilever beam, the other end that is not fixed warps upward.

The Non-patent document 3 describes that, in a case of capacitance-type diaphragm, the area of a cavity part sandwiched between the upper and lower electrodes exceeds 1,500 $\mu m^2$, (1) a very strong tensile stress exists on a diaphragm, the diaphragm itself is destroyed and the structure cannot be fabricated, (2) the compression stress is strong on a diaphragm, the diaphragm becomes uneven, (3) the tensile stress is within an appropriate range of 0 to 500 Mpa, it is possible to maintain the form of the MEMS diaphragm and to move it with a good linearity and sensitivity.

Generally, it is said that an effective means to maintain a form is to bring residual stress closer to zero. It is possible to control to some extent stress depending on the condition of fabricating the thin film that will be the materials for the structure and the heat treatment process subsequent thereto.

As a material for thin film MEMS structures, for example, polysilicon is widely used. Polysilicon fabricated usually at approximately 600° C. is faced with a strong residual stress. Therefore, the residual stress is released by a high temperature heat treatment of approximately 1,000° C.

In Patent Document 1, Non-Patent Documents 1 and 2, MEMS structures are with on a chip having a semiconductor circuit, poly-Si is used for the MEMS structures. MEMS structure parts are fabricated in the manufacturing process of the LSI devices, and film stress of poly-Si is released by high temperature heat treatment required for the manufacturing process of LSI.

However, CMOS LSI is fabricated only low temperature processes, about ~450° C., to keep its high-performance. The MEMS structure is fabricated by devising a way of avoiding any damage on the LSI process, so that the MEMS structure and CMOS LSI are made on separate chips or pasted together to obtain a hybrid product.

SiGe is proposed as a low stress film to be applied for the MEMS. SiGe can be fabricated at a low temperature.

Metal alloy and silicide films, such as Cu, W, WSi and like, are also considered to be applied for MEMS structures. These material films can also be fabricated at a low temperature by sputtering. And it is possible to control film stress by adjusting the deposition conditions. FIG. 11 shows materials that can be used for fabricating MEMS in back-end of line process conveniently, after making the LSI circuit. W, Ta, Mo and other high-melting point metals are difficult to form thick films. Al is easy to corrode. Cu has many problems in the LSI process, because it is easily diffused and polluted in LSI structure and so that diffusion barrier of Cu is necessary.

Non-patent document 3 describes that the tungsten silicide (WSi) film used in the MEMS movable part. WSi is deposition at exceeding its crystallization temperature by CVD method. Temperature dependence of stress observed in the WSi film from the room-temperature to 900° C., as temperature rises. However, when the temperature returns to the room-temperature, the residual stress will be almost the same as before the measurement.

On the other hand, Non-patent document 4 describes that, WSi films is fabricated at a low temperature (150° C.), below the crystallization temperature by sputtering. It is measured that change in the film stress during heat cycle. The measured temperature is raised to 300° C., a hysteresis occurs, the film stress, after the heat cycle, shifts to the tension side as compared with before the rise (or fall) of temperature.

The MEMS structure is often located at a closer to the surface of the chip and is sometimes exposed to the outside depending on its use. Therefore various methods of protecting the MEMS structures from the outer environment have been developed. Normally, MEMS structures are sealed up. There is some cases that electromagnetic protection or shield is needed. The Patent Document 2 describes a capacitance-type pressure MEMS sensor. In this MEMS sensor, there is an electrostatic shield film on the top of the poly-Si MEMS diaphragm, and its fixed conductive film on the GND electric ground. In this case, poly-Si film stress is controlled residual by a high-temperature heat treatment. The electromagnetic shield is adhering to the MEMS or other structures, and it maybe necessary to control the residual stress of shield film.

[Patent document 1] U.S. Pat. No. 6,472,243 Specification

[Patent document 2] International Patent Laid Open WO01/014842 Brochure

[Patent document 3] JP-A No. 321612/1996

[Non-patent document 1] Klaus Kasten et al. "CMOS-compatible capacitive high temperature pressure sensors", Sensors and Actuators 85, 2000, pp. 147-152

[Non-patent document 2] Klaus Kasten et al. "High temperature pressure sensor with monolithically integrated CMOS readout circuit based on SIMOX technology", The 11$^{th}$ International Conference on Solid-State Sensors and Actuators (Munich, Germany Jun. 10-14, 2001) Collection of preliminary papers, pp. 510-513

[Non-patent document 3] T. Fujimori et al. "Fully CMOS Compatible ON-LSI Capacitive Pressure Sensor Fabricated Using Standard Back-End-of-Line Processes", The 13th International Conference on Solid-State Sensors, Actuators and Microsystems (Seoul, Korea, Jun. 5-9, 2005) Collection of preliminary papers, pp. 37-40

[Non-patent document 4] Muh-Ling Ger, et al. "Sputtered Wsix for micro mechanical structures," J. Mater, Res., vol. 10, No. 7, July 1995

SUMMARY OF THE INVENTION

As described in the BACKGROUND OF THE INVENTION, for fabricating the MEMS structures, it is important to control the film stress of the MEMS structure parts. And it is desirable to integrate further and make them more compact by fabricating LSI and MEMS structure monolithically.

If poly-Si is used as the material of the MEMS structure, a high-temperature heat treatment is necessary to control film stress. However, high-temperature heat treatment causes damages to LSI transistors, it is difficult to integrate it with high-performance LSI unless a very limited number of manufacturing processes are adopted. This is a problem.

On the other hand, the method of using SiGe as the material of the MEMS structure involves the problem of a special deposition equipment process required, even if the temperature of deposition is low.

On the other hand, in the case of using metal films as the material of the MEMS structure, it is possible to form film at a low temperature using the sputtering method, and this method involves an advantage in that film stress can be controlled by the sputtering temperature, flow rate and pressure of gas at the time of fabricating film. However, as it is difficult to fabricate a thick film with W. At the wet etching process of the sacrifice layer, if the MEMS structure film is thin, it is unable to support its own weight, resulting in sticking and disrupting the production of the whole MEMS structure. Furthermore, in the case of Cu film, there is a problem that a special film fabricated equipment and the process for preventing pollution to the LSI are necessary.

On the other hand, according to the examination of the inventors, in the case of silicide such as MoSi, TiSi, CoSi and the like represented by tungsten silicide (WSi), due to the formation of reactive compounds, the range of stress that can be controlled at the time of deposition is narrow. As described in Non-patent document 4, there are problems such as change in film stress during the process after the fabrication of film due to the influence of heat treatment in the following process.

When it is necessary to protect and shield electromagnetically the MEMS structure from outside envelopment, for example in Patent document 2, Poly-Si is applied as an electric shield. But film stress of poly-Si is discharged by a heat treatment of close to 1,000° C. This process is problematic in that it causes damages to a high performance of LSI transistors.

The first object of the present invention is to fabricate MEMS structures whose film stress is controlled, while maintaining a high performance of LSI in a fabrication process subsequent to making the LSI. This processes enable us to monolithically integrate MEMS structures with the most advanced LSI integrated circuits The second object of the present invention is to protect the MEMS structure electrically and chemically while maintaining a high performance of the LSI and lower the film stress of the whole MEMS movable part.

In the present application, the first object is achieved by a manufacturing means of using tungsten silicide (WSi) that can be fabricated film at a low temperature, and other high-melting point metal silicone compounds for the MEMS structure, and by controlling the residual film stress at the completion of the MEMS structure by choosing an optional temperature at the deposition (T1) with reference to the subsequent heat treatment temperature (T2) that does not cause the degradation of the characteristics of the high-performance LSI necessary in the manufacturing process after the formation of film and the pseudo-crystallization temperature (T3).

The second object is achieved by fabricating a laminated structure made of a plurality of layers including a high-melting point metal or a high-melting point metal silicon compound of which the residual stress can be controlled for the movable part of the MEMS structure, and by adjusting the stress of the whole movable part by the stress control of the high-melting point metal or the high-melting point metal silicon compound film by controlling the stress of the whole movable part of the semiconductor with MEMS structure.

We will describe below in details the means for solving the problems by the present invention.

As described in the BACKGROUND OF THE INVENTION, Non-patent document 4 describes that the residual stress of the tungsten silicide thin film fabricated by the sputtering method at low temperature ranging between the room temperature and 150° C. changes by a post heat treatment at 300° C. In view of such a publicly known fact, we made various reviews thinking that the stress of a metal silicide film such as tungsten silicide may change in comparison with immediately after the formation of film even by a heat treatment of low temperature applicable in the back-end of line process of manufacturing semiconductor devices.

As a result, we discovered a finding that on metal films including silicon and silicided films the ultimate residual stress can be controlled by the relationship between the temperature T1 at the time of deposition, the temperature T2 experienced in the subsequent post-manufacturing process and the pseudo-crystallization temperature T3. In other words, we found that it is possible to control intentionally the ultimate residual stress by optionally choosing the deposition temperature T1 with reference to the subsequent heat treatment temperature T2 whose temperature is limited to some extent by the subsequent process and the pseudo-crystallization temperature T3 determined by the physical property of the substance.

In other words, although the fact that the residual stress of a tungsten silicide film changes by the heat treatment after the formation of film is described in the Non-patent document 4 mentioned above, we made it clear that the ultimate stress can be controlled extensively by adding the choice of the deposition temperature T1 with reference to the pseudo-crystallization temperature T3.

We will describe the details of the controlling method of stress by taking the case of tungsten silicide film with reference to FIGS. 1 to 3.

Generally, the crystallization temperature of tungsten silicide in the bulk state is said to be 600° C. or above. We confirmed that the crystallization of a tungsten silicide thin film fabricated on the Si-substrate made of silicon and the like progresses accompanied by an abrupt change in the film stress by a heat treatment in the range of approximately 400° C.-450° C. Accordingly, for the sake of convenience, we call here the crystallization at the range of approximately 400° C.-450° C. "pseudo-crystallization," and the temperature range T3 "pseudo-crystallization temperature." With regards to WSi thin film subjected to heating process at 450° C., we measured the obvious peak of WSi intermetallic compound by the XRD measurement and confirmed that it has crystallized.

FIGS. 1 to 3 show graphs showing stress changes at the time of heating of a general thin film. FIGS. 1 to 3 show changes in stress when, after fabricating a tungsten silicide film on a silicon substrate at an optional temperature T1 in a deposition apparatus, the sample withdrawn from the apparatus and cooled down to the room temperature is then set on a stress measuring apparatus, heated and cooled again from an optional temperature. If the optional temperature at which temperature fall begins is brought to agree with the subsequent heat treatment temperature T2, the stress change during the subsequent heat treatment process can be reproduced fictitiously from FIGS. 1 to 3, and it is possible to assume the stress of the tungsten silicide film after the subsequent heat treatment process. In view of the above description, we call the same hereafter as "the starting temperature of temperature fall=subsequent heat treatment temperature T2."

FIG. 1 is a graph showing changes in stress simulating the case "T1>T2" wherein the temperature T1 at the time of deposition is higher than the subsequent heat treatment temperature T2 experienced in the subsequent manufacturing process. Because of the lack of experience of a temperature higher than that prevailing at the time of deposition T1, stress is determined by the film-fabricating temperature, and the film stress immediately after the formation of film will be the residual stress at the time of completion of the MEMS structure. FIG. 1 shows a case of fabricating film at 350° C. followed by a temperature rise up to 300° C., wherein the residual stress was same both immediately after the formation of film and after the measurement of stress after heating at 200 Mpa in the tension direction.

FIG. 1 shows the case of T2<T1<T3. However, equally in the case of (T1≧T3) wherein the deposition temperature T1 is higher than the crystallization zone temperature T3, "the stress immediately after the formation of film" will be equal to "the ultimate residual stress."

When the film-fabricating temperature T1 shown in FIGS. 2 and 3 is lower than the heat treatment temperature T2 experienced in the subsequent manufacturing process, the ultimate residual stress changes depending on the relations among T1, the subsequent process temperature T2 and the crystallization zone temperature T3.

FIG. 2 is a graph of stress changes simulating the case of "T1<T2<T3" wherein the subsequent heat treatment temperature T2 is lower than the crystallization zone temperature T3.

FIG. 2 shows two patterns of stress change, one of which is the case wherein the film is fabricated at a temperature T1 close to the room temperature shown by a solid line, and the other is the case wherein the film is fabricated at a temperature T1' shown by a dotted line lower than the subsequent heat treatment temperature T2 but higher than the deposition temperature T1 shown by a solid line. In any case, stress changes in the tensile direction at the temperature zone higher than the film-fabricating temperature as a result of rise in temperature. This is thought to be due to a partial crystallization in the film and a gradual decline in cubic volume as a result of a temperature higher than the film-fabricating temperature.

The ultimate residual stress, which was on the compression side at the time of deposition in the case of film-fabricating at the temperature T1 shown by a solid line, turned to the tensile side when the temperature returned to the room temperature.

The WSi film is fabricated at a temperature T1' (T1' is higher than T1), the residual stress after the fabrication of film was a little tensile than that of fabricated at T1.

However, the ultimate residual film stress of deposited at T1' film, when the stress measuring returned to the room temperature, the residual stress of deposited at T1' film was a little compressive side than that of fabricated at T1. (the maximum stress measured temperature, can be considered to T2, almost the same).

This seems due to the fact that, due to a higher film-fabricating temperature T1' and the presence of a zone that had already crystallized at the time of fabricating film, the partial crystallization at the time of subsequent heat treatment was limited, and volumetric change was reduced and the volume of change in stress towards to tension side became smaller.

In other words, in the case of T1<T2<T3, as the film-fabricating temperature T1 is hissed, the film stress immediately after the formation of film shifted towards the tensile side. However, the ultimate residual stress after having been subjected to the subsequent heat treatment temperature T2 becomes smaller in the tensile direction than in the case of being subjected to a lower film-fabricating temperature. Thus, it is possible to control the ultimate residual stress by the choice of the temperature at the time of deposition T1.

FIG. 3 is a graph showing changes in stress simulating the case of "T1<T3<T2" wherein the subsequent heat treatment temperature T2 is higher than the pseudo-crystallization temperature T3.

In passing through the pseudo-crystallization temperature T3, stress changes substantially in the direction of tension. This is assumed due to the occurrence of abrupt crystallization resulting to a sharp reduction in volume. The ultimate residual stress was tensile of 1 Gpa or more.

Thus, in the case of tungsten silicide film, it is possible to form MEMS structures having an optional residual stress by choosing a film-fabricating temperature T1 with reference to the heat treatment temperature T2 in the subsequent process and the crystallization zone temperature T3. In the case of the tungsten silicide film of this case, it was possible to control stress within a range of −200 MPa to 1 Gpa or more.

Here, we described in details the case of the tungsten silicide film. In the case of using other metal silicone compounds, the tendency of stress variation and control method is similar to that of the tungsten silicide film although there are differences in the exact value of residual stress.

And the examples of examination on the materials usable as electric shield and their suitability as such are shown in FIG. 12. Even in the case of applying them as electric shield, it is necessary to control residual stress because they are parts of the main body of the MEMS structure or a structure corresponding thereto (adhering on the movable part of the MEMS structure and the like). Al leaves a room for concern over its corrosiveness, and polysilicon used in Patent document 2 allows no high-temperature heat treatment and therefore it is impossible to control the residual stress thereof.

On the one hand, for this use, a silicide such as tungsten silicide is useful. And as there is no need of thickening the film for use as a shield, metals such as Ta and materials that need no high-temperature process such as amorphous silicon and whose residual stress can be reduced to a low level can be applied.

According to the present invention, it is possible to regulate the residual stress at completion of the MEMS structure, and to adjust MEMS structure to the desired form by controlling the residual stress in the deposition process.

As a result, it is possible to form MEMS structures whose stress is controlled in the manufacturing process after the LSI is made and to integrate MEMS structure and LSI on a single chip.

BRIEF DESCRIPTION OF THE INVENTION

FIG. 11 is a table in which the main thin film material applicable to the construction of the MEMS structure in the back-end of line process of a semiconductor circuit and their suitability for use in the MEMS are reviewed; and FIG. 12 is a table in which the suitability of the material for the shield film electronically protecting the MEMS structure from the outside is reviewed.

DESCRIPTION OF THE PREFERRED EMBODIMENTS

We will describe in details below the embodiments of the present invention with reference to drawings. Incidentally, in the whole view for describing the embodiment of the present invention, we marked the same component in principle by the same symbol, and we omitted their repeated description.

First Embodiment

This embodiment applies the present invention to a capacitance-type pressure sensor constituted by MEMS structures, and constitutes MEMS structures with semiconductor device incorporating digital circuits, analog circuits such as amplifiers for amplifying sensor signals and for transmitting and receiving wireless signals, flush memory circuits and the like on a single chip.

Figure 1:
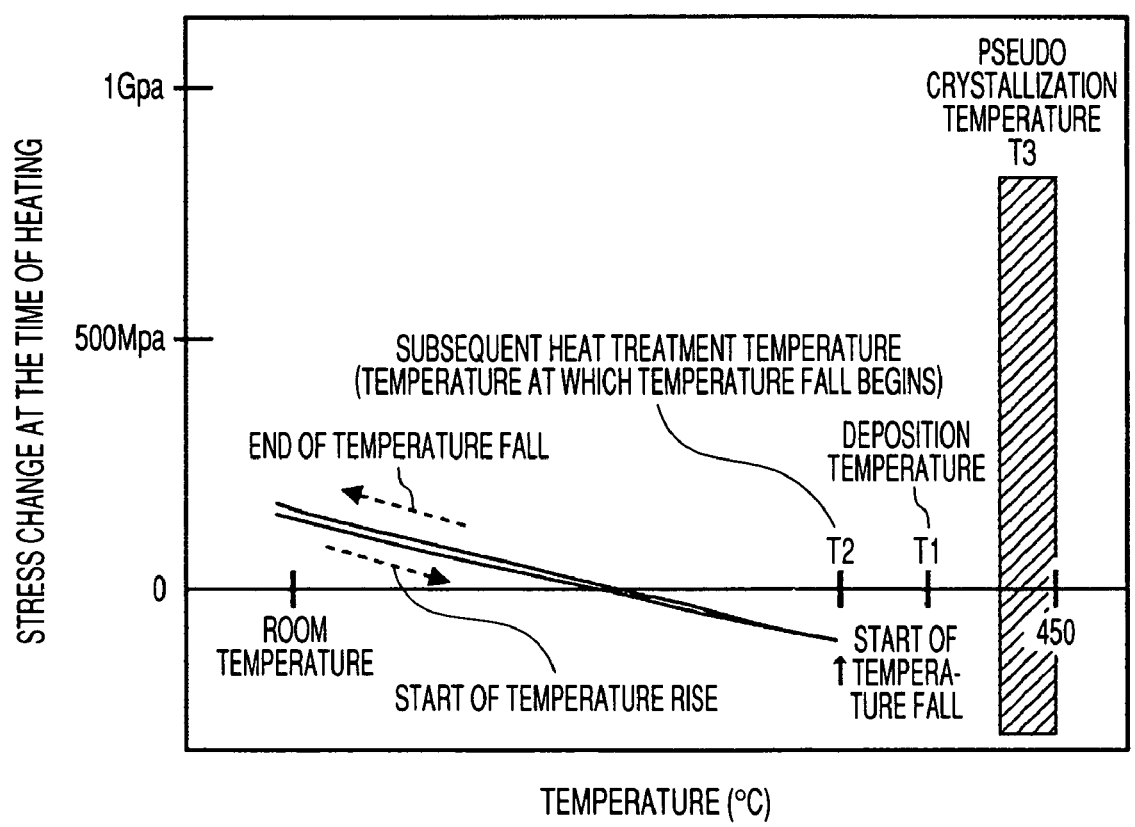
FIG. 1 is a graph showing an example of changes in film stress by the deposition temperature and subsequent heat treatment of the tungsten silicide film by the sputtering method.
Figure 2:
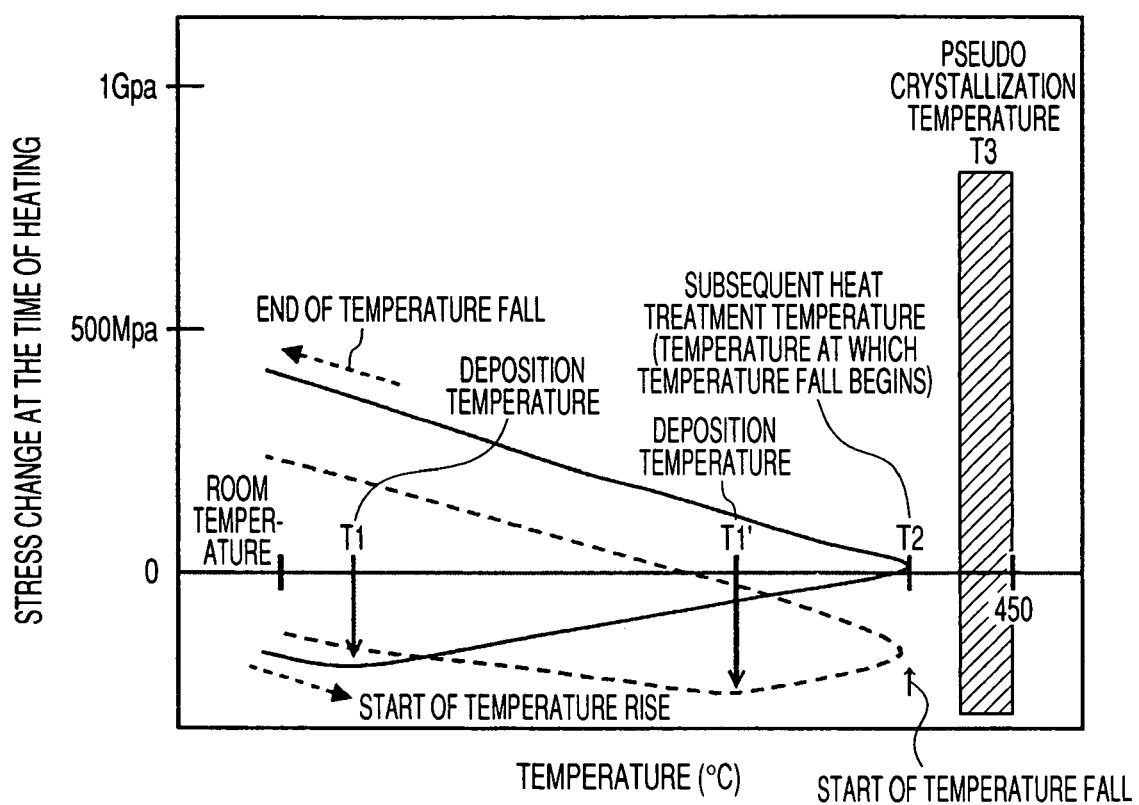
FIG. 2 is a graph showing another example of changes in film stress by the deposition temperature and subsequent heat treatment of the tungsten silicide film by the sputtering method.
Figure 3:
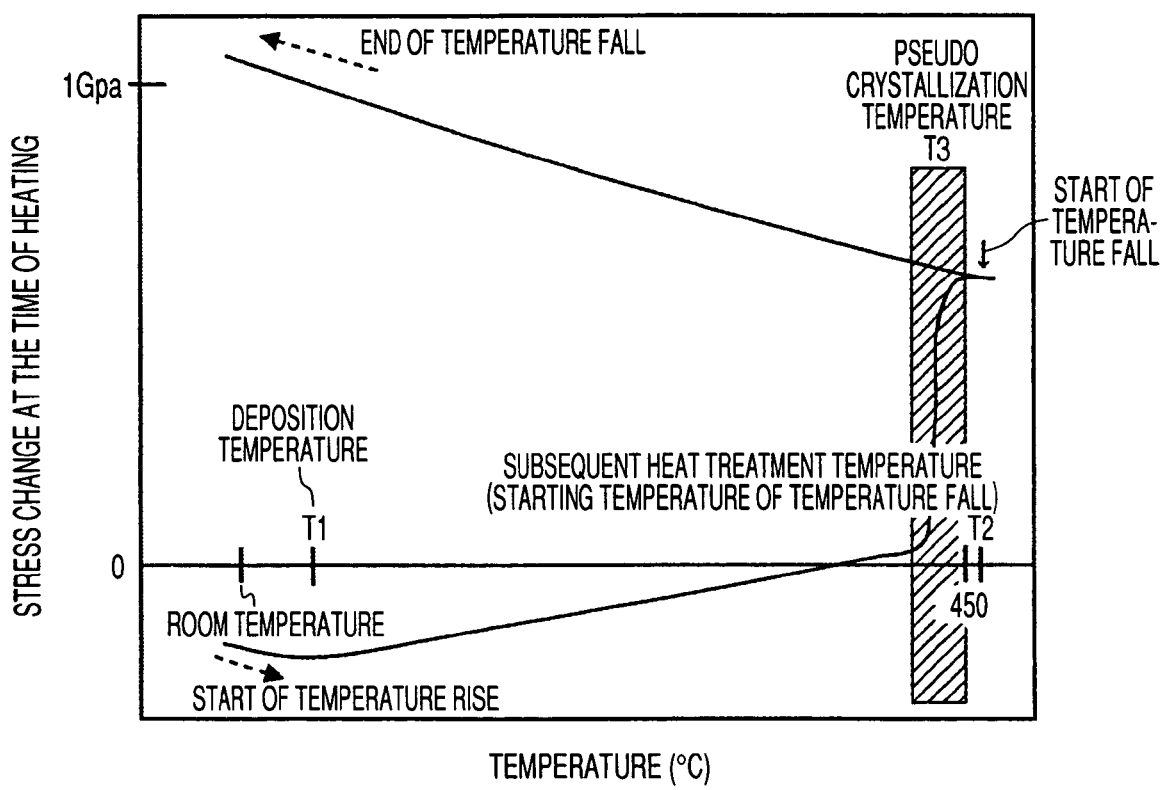
FIG. 3 is a graph showing another further example of changes in film stress by the deposition temperature and subsequent heat treatment of the tungsten silicide film by the sputtering method.
Figure 4:
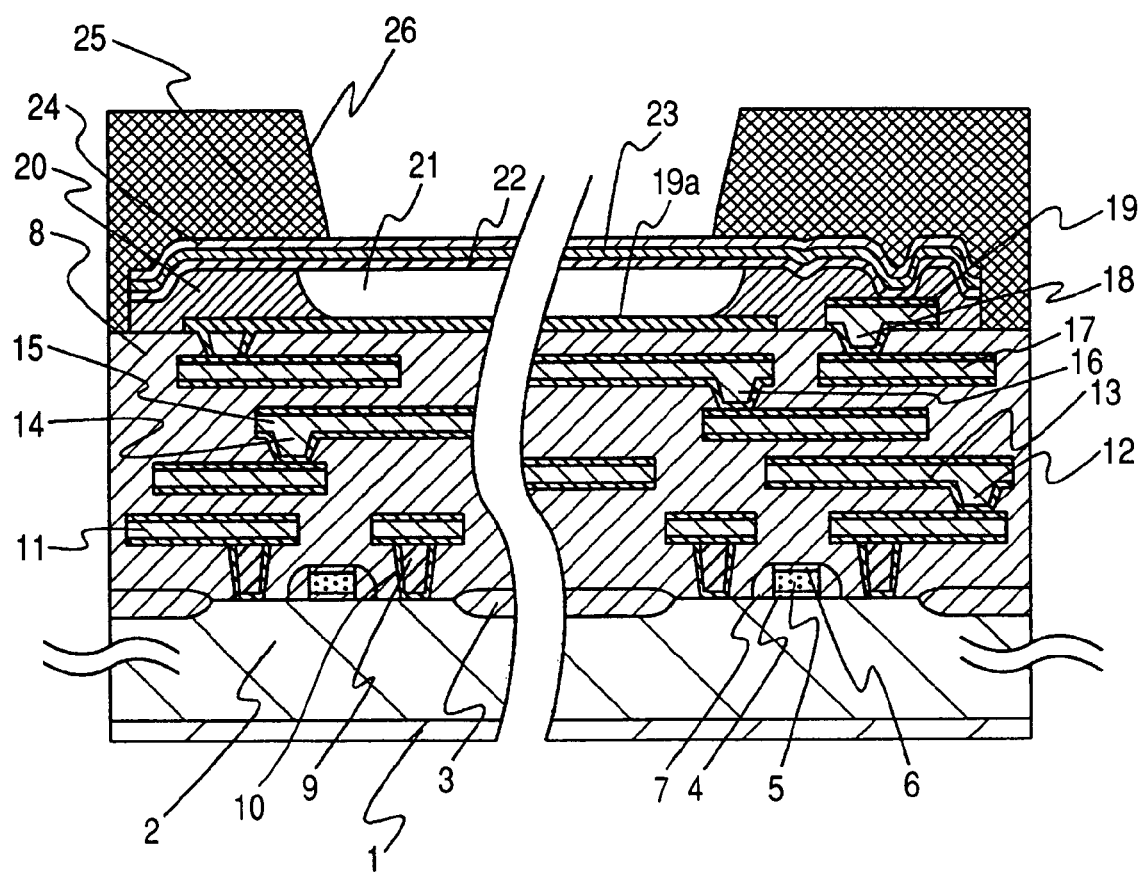
FIG. 4 is a cross sectional view of the main parts including the movable part of the MEMS with semiconductor device incorporating a sensor which is an embodiment of the present invention.

FIG. 4 is a cross sectional view of the semiconductor device incorporating pressure sensors including pressure detecting units of this embodiment. A dispersion zone 2 and locos 3 are disposed on top of the silicon substrate 1, and a MOS transistor including a gate oxide film 4, a gate electrode 5, a cap insulating film 6, a side wall 7 is fabricated on top thereof. The shortest gate length of the transistor is 0.35 μm.

A silicon oxide film 8 is disposed on top of the transistor, and a contact hole 9 is fabricated on top of the dispersion layer, and the inside is a plug 10 including a titanium nitride film and a tungsten film.

The plug 10 is connected with a first back-end of line layer 11 made of aluminum alloy having a titanium nitride barrier film. On top of the first back-end of line layer 11, a second back-end of line layer 13 is fabricated through a through hole 12, a third back-end of line layer 15 connected with the second back-end of line layer 13 is fabricated through a through hole 14, a fourth back-end of line layer 17 connected with the third back-end of line layer 15 is fabricated through a through hole 16, and a fifth back-end of line layer 19 connected with the fourth back-end of line layer 17 is fabricated through a through hole 18. Each of the second back-end of line layer 13—the fifth back-end of line layer 19 is made of an aluminum alloy containing titanium nitride barrier film like the first back-end of line layer 11. And each of the first back-end of line layer 11—the fifth back-end of line layer 19 is insulated by a silicon oxide film 8. And during the manufacturing process of the semiconductor device according to this embodiment, the surface of each back-end of line layer is almost planarized by means of CMP (chemical mechanical polishing) as required.

The pressure detecting unit of the pressure sensor which is a MEMS structure according to the first embodiment partially forms a silicon oxide film 20 partially having cavities 21 in the upper part of the lower electrode 19a connected with the through hole 18. The inside of the cavity 25 is filled with a gas at nearly 1 atmospheric pressure the main component of which is nitrogen.

The tungsten silicide film 22 fabricated on top of the silicon oxide film 20 has a plurality of etching holes 22a, not shown in the figure, into which hydrofluoric acid is injected to form cavities 21 in the silicon oxide film 20.

With regard to the tungsten silicide film 22 fabricated on top of the silicon oxide film 20, the temperature at the time of deposition T1 on top of the semiconductor is set at 350° C., and the temperature is regulated to be lower than the heat treatment temperature T2 of 450° C. experienced in the subsequent manufacturing process, and the heat treatment temperature T2 is regulated to be lower than the crystallization temperature T3 of 650° C. for the tungsten silicide film so that the film stress at the time of completion may be 500 Mpa to form a cavity diaphragm part of a good shape.

A silicon oxide film 23 and a silicon nitride film 24 fabricated by the plasma CVD (Chemical Vapor Deposition) method are laminated on top of the tungsten silicide film 22. The silicon oxide film 22 and the silicon nitride film 24 have respectively the role of closing the etching holes 22a and that of preventing the infiltration of water from outside.

In this embodiment, the laminated film of the silicon+ nitride film 24, the silicon oxide film 23 and the tungsten silicide film 22 constitutes a diaphragm. The tungsten silicide film 23 fabricating part thereof is connected with the fifth back-end of line layer through the through hole 18. A photosensitive polyimide film 26 is fabricated in a part of the upper layer of the silicon nitride film 25.

Incidentally, while, in FIG. 4 of this embodiment, a metal film separate from the fifth back-end of line layer is fabricated in the lower electrode of the capacitance detecting unit of the pressure sensor, the fifth back-end of line layer may be substituted for the other.

And in FIG. 4, we described in details the case where the back-end of line layer is made by an aluminum alloy having a titanium nitride barrier film. In the case the back-end of line is presence fabricated by aluminum, cupper or cupper alloy, in FIG. 4 can be similarly applied and constituted provided that the care necessary in the ordinary semiconductor manufacturing process, for example, the measures for preventing the dispersion of metal and pollution in the LSI layer.

Figure 5:
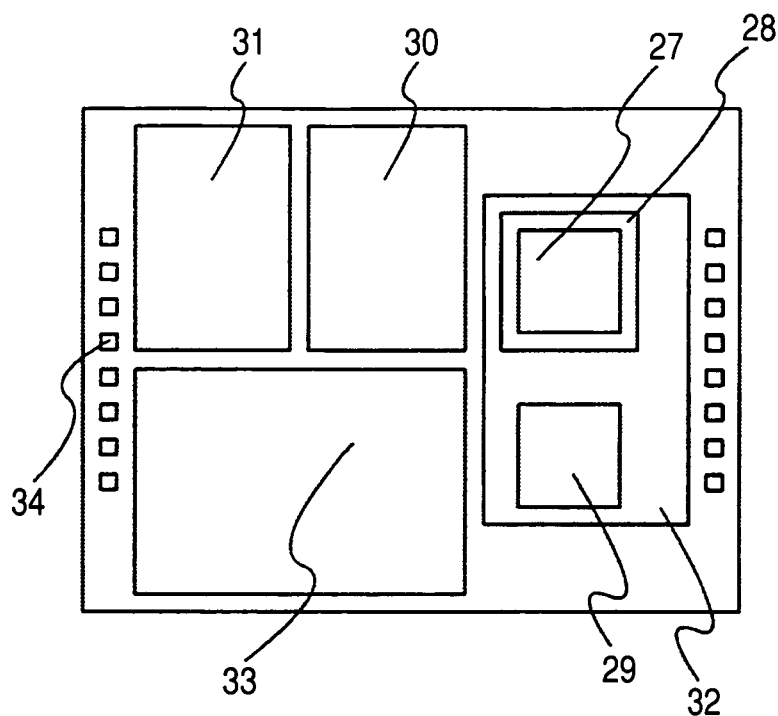
FIG. 5 is a top plan view of the MEMS with semiconductor device incorporating a sensor which is an embodiment of the present invention.

FIG. 5 is a top plan view showing an example of MEMS structure with semiconductor device made by applying the present invention according to the example of constituting a chip including the pressure sensor of the first embodiment described in FIG. 4. An aperture 28 for detecting pressure is disposed on top of the pressure sensor 27 according to the back-end of line process MEMS. In addition, the reference capacitance 29, the digital circuit 30, the wireless transmitting and receiving unit 31, the analog circuit 32 including an amplifier for amplifying sensor signals, the flush memory circuit 33, the pad unit 24 for electrically connecting with the outside and the like constitute the whole device.

Figure 6:
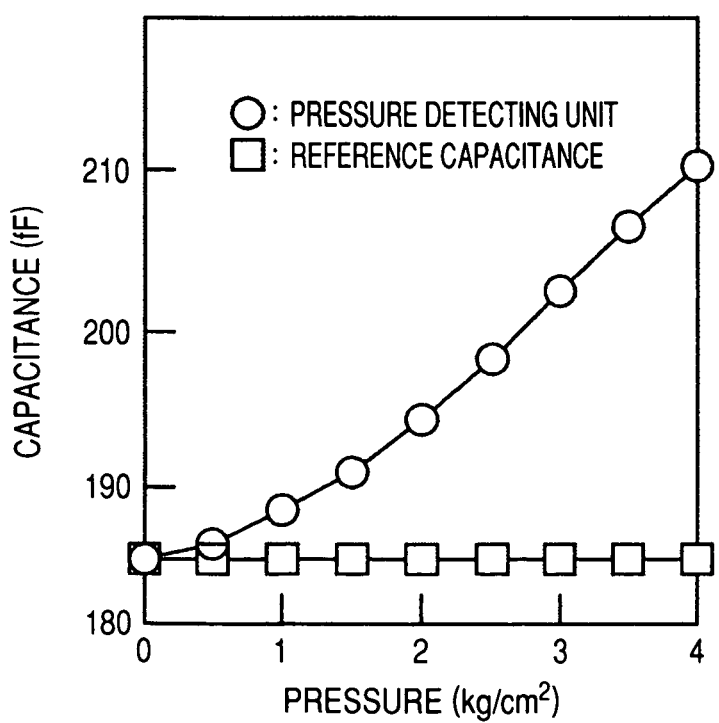
FIG. 6 is a graph showing the sensitivity of the pressure sensor according to the first embodiment.

As a result of pressurization tests we actually conducted by using a MEMS pressure sensor made in this way, we obtained good output results in which the capacitance value changed linearly as pressure increased as shown in FIG. 6.

Figure 7:
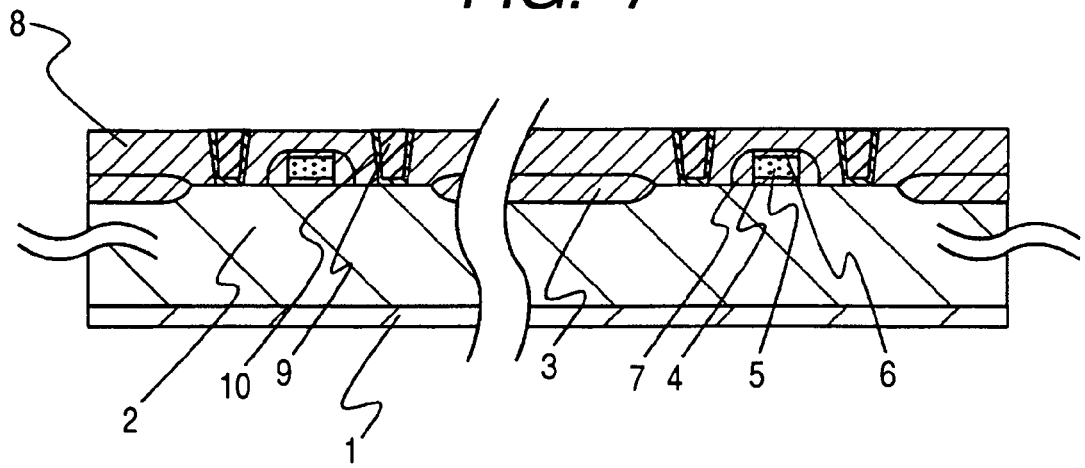
FIG. 7 is a cross sectional view showing the manufacturing method of the LSI part of the MEMS with semiconductor device incorporating a movable part which is an embodiment of the present invention.
Figure 8:
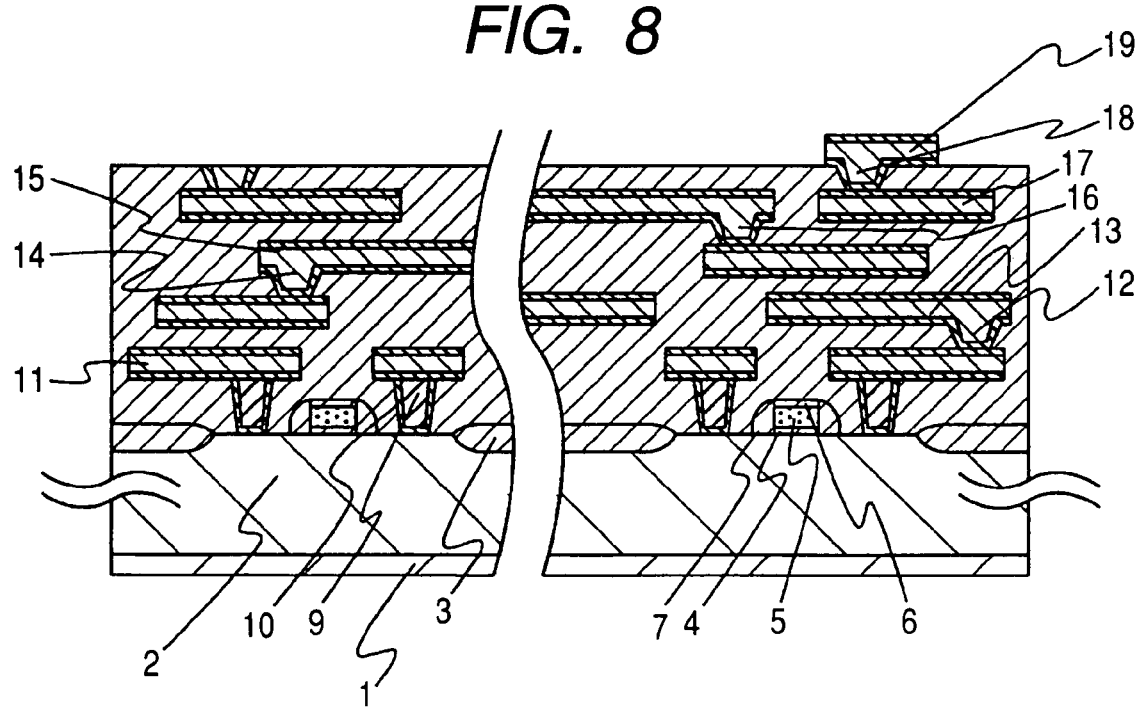
FIG. 8 is a cross sectional view showing the manufacturing method of the MEMS with semiconductor device incorporating a sensor following FIG. 7.

With reference to FIGS. 7 and 8, we will describe the manufacturing process of the semiconductor circuit part of the back-end of line MEMS with semiconductor device incorporating pressure sensors of this embodiment. The minimum design dimension of the semiconductor device circuit is 0.35 µm.

As shown in FIG. 7, to begin with, a dispersion zone 2 and a locos 3, and a gate oxide film 4 are fabricated on the surface of the silicon substrate 1 by the photo lithography technology, the iontophoresis technology and the like. After depositing a polysilicon film and a cap insulation film 6 on top of the same, the gate or the transistor 5 is fabricated by using the photo lithography technology and the dry etching technology. After fabricating the sidewall 6 with silicon nitride for protecting the gate or the transistor 5, the insulation film 8 is deposited. A contact hole 9 is opened in the insulation film 8 and a plug 10 is fabricated.

Following FIG. 7, FIG. 8 shows the manufacturing process. On top of the silicon oxide film 8 shown in FIG. 7, the first back-end of line layer 11 made of an aluminum alloy including a titanium nitride barrier film, the second back-end of line layer 13, the third back-end of line layer 15, the fourth back-end of line layer 17 are successively fabricated by sandwiching each of them with an insulation film layer 8 made of silicon oxide and by planarizing their surface by using the CMP process as required. Each back-end of line layer is electrically connected through the through holes 12, 14, and 16 fabricated in the silicon oxide film 8 of the insulation layer. After fabricating the through hole 18 to the fourth back-end of line layer 17, the uppermost layer of the insulation film 8 is planarized by CMP, and the fifth back-end of line layer 19 connected electrically with the back-end of line MEMS structure is fabricated. In the case of the pressure sensor shown in FIG. 4, above this FIG. 8, we fabricated the MEMS pressure sensor part.

Figure 9:
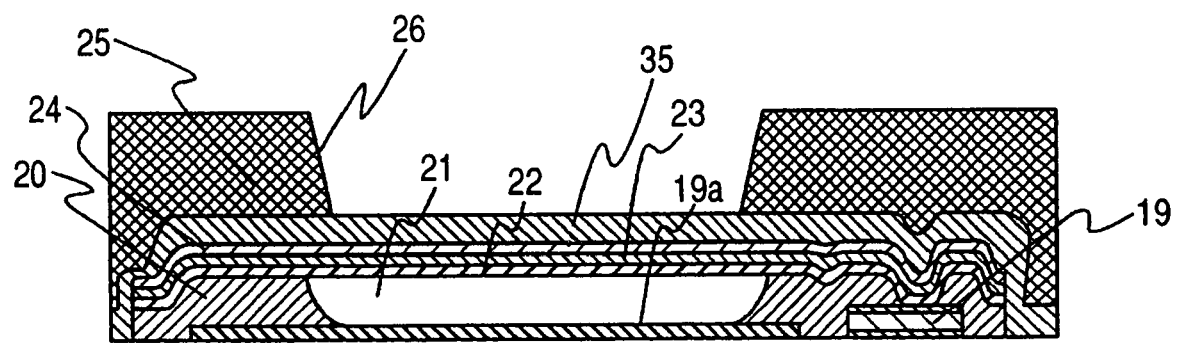
FIG. 9 is a cross sectional view showing an example of a MEMS movable component, the pressure detecting unit of the pressure sensor in which the stress of the laminated film of the diaphragm part is adjusted by a metal or metal compound shield.

FIG. 9 shows an example of fabricating a shield layer 35 by a tungsten silicide film on top of the silicon nitride film 24 of the MEMS pressure sensor wherein a tungsten silicide film is used for the upper electrode shown in FIG. 4. Although omitted in FIG. 9, the LSI circuit shown in FIG. 8 is fabricated below the part shown in FIG. 9, and the fifth back-end of line layer 19 of both figures is the same thing.

In FIG. 9, the thin film structure of the diaphragm in the upper part of the cavity constitutes a laminated structure with the shield layer 35 made of tungsten silicide with the insulation layer and the upper electrode made of WSie.

The stress of each laminated thin film constituting the diaphragm is made up of tensile/compressive/tensile at the time of completion of the MEMS with semiconductor device. And the insulation film used here has a particularly strong compressive stress due to the convenience of the manufacturing process. Accordingly, in a sample of similar form in which the shield layer tungsten silicide of the uppermost layer was not fabricated, the diaphragm part bulged upward in the form of convex due to the compressive stress of the insulation film. On the other hand, in the embodiment shown in FIG. 9, we controlled the shield film disposed at the top with stress so that the stress of the whole laminated layer film may be 500 Mpa. We controlled the stress of the tungsten silicide film by proceeding to a subsequent heat treatment after fabricating the shield. As a result of controlling the stress of the whole laminated layer film by disposing a shield film in this way, we could manufacture the diaphragm with a good flatness and form even when an insulation film having a strong compressive stress. In the case of this form, we could obtain output capacitance values of a good linearity similar to FIG. 6 at the time of applying pressure.

Figure 10:
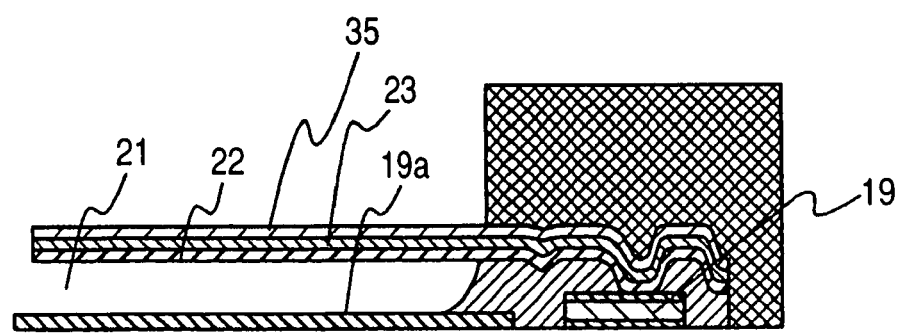
FIG. 10 is a cross sectional view showing an example of a MEMS movable component, acceleration sensor.

FIG. 10 shows an example of fabricating a two-axis acceleration sensor on the LSI circuit. Although omitted in FIG. 10, the LSI circuit shown in FIG. 8 is fabricated below the part shown in FIG. 10, and the fifth back-end of line layer 19 of both figures is the same thing.

In FIG. 10, acceleration is detected by taking advantage of the fact a cantilever beam structure located in the upper part of a cavity changes its position when an acceleration is applied to it and as a result the capacitance value with the lower electrode changes. The thin film structure constituting the cantilever beam includes a shield layer 35 made of tungsten silicide, an insulation film 23 and a laminated layer structure 22 of the upper electrode made of tungsten silicide. We adjusted the stress on the shield film disposed in the uppermost part so that the stress of the whole laminated layer film may be 500 Mpa. We controlled the stress of the tungsten silicide film by proceeding to a subsequent heat treatment after fabricating the shield. As a result of controlling the stress of the whole laminated layer film by disposing the shield film in this way, we could manufacture the cantilever beam with a good flatness and form. As a result of measuring acceleration with the acceleration sensor according to this embodiment, we could obtain output values of a good linearity.

We have described above specifically the invention made by the inventors with reference to the embodiments. However, the present invention is not limited to the embodiments described above, and it is needless to say that various variations are possible provided that they do not deviate from the spirit and principle of the invention.

What is claimed is:

1. A manufacturing method of microelectromechanical system (MEMS) structures with semiconductor devices, comprising the steps of:
   fabricating an electronic circuit on a substrate;
   fabricating back-end of line layers on said electronic circuit;
   fabricating a lower electrode connected with said back-end of line layers;
   fabricating a sacrificial layer out of silicon oxide on said lower electrode;
   fabricating movable electrode parts of MEMS structures out of a first silicide or a metal within a plurality of etching holes on said sacrificial layer;
   wherein peripheral areas of said movable electrode parts are fixed,
   removing said sacrificial layer by injecting hydrofluoric acid into said etching holes;
   fabricating a silicon oxide film on said movable electrode parts to close said etching holes;
   fabricating a silicon nitride film on said silicon oxide film;
   fabricating a shield film made of a second silicide on said silicon nitride film;
   wherein peripheral areas of said shield film are fixed, and
   fabricating a photosensitive polyimide film on said silicon nitride film; wherein
   said MEMS structures, including said movable electrode parts and said shield film being formed by implementing a sputtering method at a film-fabricating heat treatment temperature T1, subsequently heating from T1 to a subsequent heat treatment temperature T2, which is higher than T1 and lower than a pseudo-crystallization temperature range T3,
   wherein said pseudo-crystallization temperature range T3 is 400° C.-450° C.

2. The manufacturing method of MEMS structures according to claim 1, wherein said movable electrode film parts is fabricated with W or WSi.

3. The manufacturing method of MEMS structures according to claim 1, wherein said shield film is fabricated with WSi.

* * * * *